US011322634B2

(12) United States Patent
Hao et al.

(10) Patent No.: US 11,322,634 B2
(45) Date of Patent: May 3, 2022

(54) COPPER-BASED CHALCOGENIDE PHOTOVOLTAIC DEVICE AND A METHOD OF FORMING THE SAME

(71) Applicant: NEWSOUTH INNOVATIONS PTY LIMITED, Sydney (AU)

(72) Inventors: Xiaojing Hao, Matraville (AU); Fangyang Liu, Changsha (AU); Jialiang Huang, Cherrybrook (AU); Chang Yan, Kensington (AU); Kaiwen Sun, Maroubra (AU); Martin Andrew Green, Bronte (AU)

(73) Assignee: NEWSOUTH INNOVATIONS PTY LIMITED, Sydney (AU)

( * ) Notice: Subject to any disclaimer, the term of this patent is extended or adjusted under 35 U.S.C. 154(b) by 0 days.

(21) Appl. No.: 16/311,845

(22) PCT Filed: Jun. 21, 2017

(86) PCT No.: PCT/AU2017/050630
§ 371 (c)(1),
(2) Date: Dec. 20, 2018

(87) PCT Pub. No.: WO2017/219082
PCT Pub. Date: Dec. 28, 2017

(65) Prior Publication Data
US 2019/0207050 A1    Jul. 4, 2019

(30) Foreign Application Priority Data

Jun. 21, 2016  (AU) .................. 2016902434

(51) Int. Cl.
H01L 31/0749    (2012.01)
H01L 31/032    (2006.01)
(Continued)

(52) U.S. Cl.
CPC ...... H01L 31/0749 (2013.01); H01L 31/0296 (2013.01); H01L 31/0322 (2013.01);
(Continued)

(58) Field of Classification Search
CPC ............. H01L 31/0749; H01L 31/0322; H01L 31/03923; H01L 31/1828; H01L 31/0296; H01L 31/0326
See application file for complete search history.

(56) References Cited

U.S. PATENT DOCUMENTS

2013/0125988 A1* 5/2013 Cao .................. H01L 21/02568
136/264
2015/0075601 A1    3/2015 Adachi et al.
2016/0087118 A1* 3/2016 Shibasaki ....... H01L 31/022425
136/256

FOREIGN PATENT DOCUMENTS

CN        105449009 A       3/2016
EP        2 999 007 A1      3/2016
(Continued)

OTHER PUBLICATIONS

Vermang et al., "Development of rear surface passivated Cu(In,Ga)Se2 thin film solar cells with nano-sized local rear point contacts,"Solar Energy Materials and Solar Cells, vol. 117, Oct. 2013, pp. 505-511 (Year: 2013).*
(Continued)

Primary Examiner — Jesse Y Miyoshi
(74) Attorney, Agent, or Firm — Ajay A. Jagtiani; Miles & Stockbridge P.C.

(57) ABSTRACT

A method for forming a photovoltaic device comprising the steps of: providing a first conductive material on a substrate; depositing a continuous layer of a dielectric material less than 10 nm thick on the first conductive material; annealing the first conductive material and the layer of dielectric material; forming a chalcogenide light-absorbing material
(Continued)

on the layer of dielectric material; and depositing a second material on the light-absorbing material such that the second material is electrically coupled to the light-absorbing material; wherein the first conductive material and the dielectric material are selected such that, during the step of annealing, a portion of the first conductive material undergoes a chemical reaction to form: a layer of a metal chalcogenide material at the interface between first conductive material and the dielectric material; and a plurality of openings in the layer of dielectric material; the openings being such to allow electrical coupling between the light-absorbing material and the layer of a metal chalcogenide material. Additionally contemplated is a photovoltaic device formed by this method.

14 Claims, 6 Drawing Sheets

(51) Int. Cl.
  *H01L 31/0296* (2006.01)
  *H01L 31/0392* (2006.01)
  *H01L 31/18* (2006.01)
  *H01L 21/02* (2006.01)

(52) U.S. Cl.
  CPC .... *H01L 31/0326* (2013.01); *H01L 31/03923* (2013.01); *H01L 31/03925* (2013.01); *H01L 31/1816* (2013.01); *H01L 31/1828* (2013.01); *H01L 31/1832* (2013.01); *H01L 31/1864* (2013.01); *H01L 21/02568* (2013.01); *Y02E 10/541* (2013.01)

(56) References Cited

FOREIGN PATENT DOCUMENTS

WO 2015/081379 A1 6/2015
WO 2015/120512 A1 8/2015

OTHER PUBLICATIONS

Kim et al., "Improving the open-circuit voltage of Cu2ZnSnSe4 thin film solar cells via interface passivation", Progess in Photovoltaics: Research and Applications; John Wiley & Sons, Ltd. (2017).
Office Action received in Chinese Patent Application No. 2017800390146 dated Nov. 19, 2021.

* cited by examiner

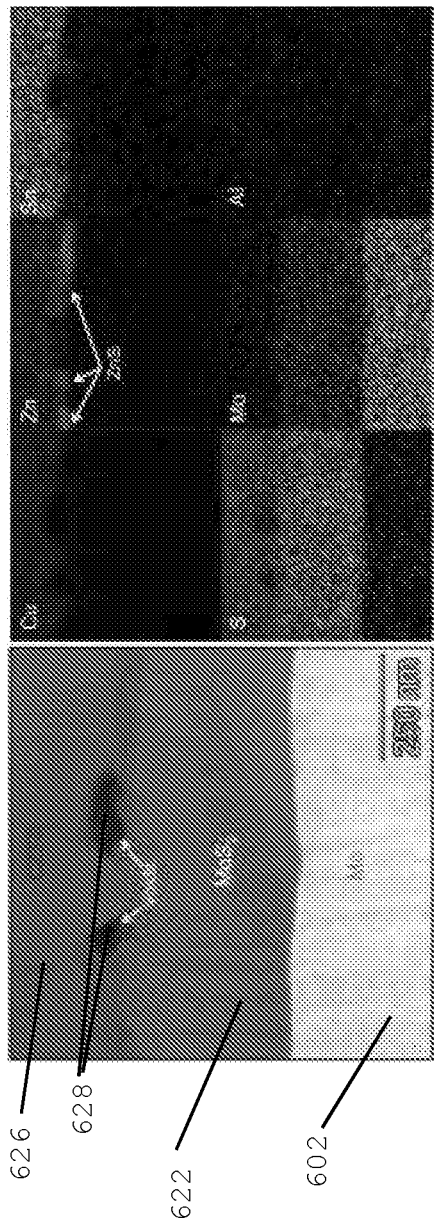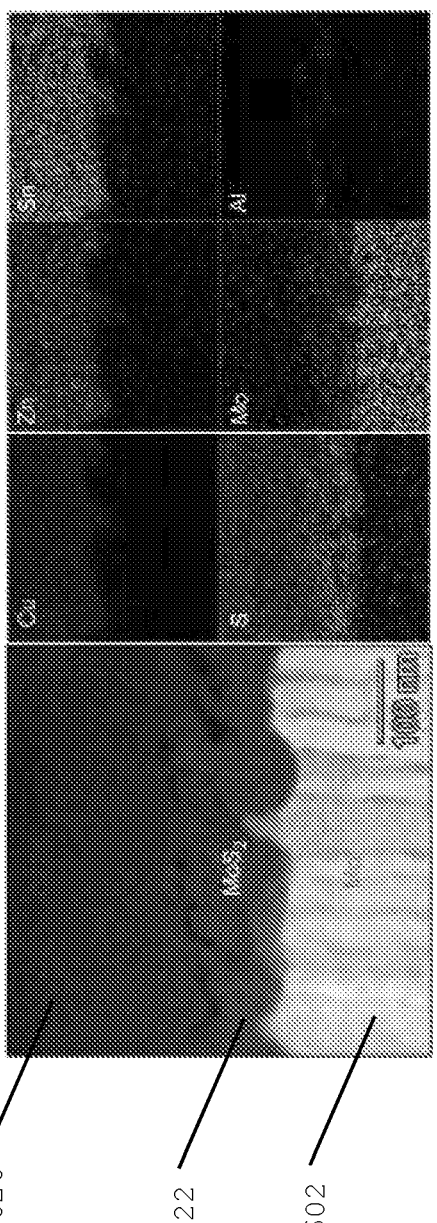
FIGURE 6(a) FIGURE 6(b) FIGURE 6(c) FIGURE 6(d)

COPPER-BASED CHALCOGENIDE PHOTOVOLTAIC DEVICE AND A METHOD OF FORMING THE SAME

FIELD OF THE INVENTION

The present invention generally relates to a method of forming a photovoltaic cell comprising a copper based chalcogenide light-absorbing material and a photovoltaic cell formed in accordance with the method.

BACKGROUND OF THE INVENTION

Thin film photovoltaic devices with a copper based chalcogenide light-absorbing material represent an important advancement in thin film photovoltaics technology. Kesterite (CZTS, CZTSe or CZTSSe) based thin film photovoltaic devices, for example, use earth abundant materials and inexpensive fabrication techniques. Kesterite is a quaternary compound constituted by copper (Cu), zinc (Zn), tin (Sn) and sulphur (S) or selenium (Se). Kesterite has the chemical formula $Cu_2ZnSn(S, Se)_4$. Depending on whether the last element is sulphur or selenium the acronyms CZTS or CZTSe are used for Kesterite. By mixing CZTS and CZTSe, absorbers with a direct bandgap, tunable between ~1.0 eV and ~1.5 eV and a large absorption coefficient can be formed. These properties are ideal for a thin film photovoltaic device absorber.

Current kesterite photovoltaic devices are realized on soda lime glass substrates coated with a molybdenum (Mo) layer which functions as a back contact. Generally, a CZTS (Se) absorber layer is formed by annealing a material containing the precursor elements for CZTS(Se). This material is usually deposited using PVD, CVD techniques or solution techniques. A front contact consisting of a ZnO/AZO, ITO, BZO layer and a metallic material is normally realized on the absorber layer. Generally, kesterite photovoltaic devices also have a CdS intermediate layer between the absorber layer and the front contact.

Although it is widely acknowledged that kesterite photovoltaic devices could potentially perform better than other thin film photovoltaic technologies, the current performance of these devices is still below the market average. Record efficiencies of kesterite based photovoltaic devices have been reported between 8% and 12.6% compared to, for example, 21.7% for $Cu(In, Ga)Se_2$ (CIGSe) thin film photovoltaic devices.

Some of the causes of the reduced performance of kesterite photovoltaic devices are related to poor structural and electrical properties of the region between the light absorbing layer and the molybdenum which leads to high carrier recombination velocities.

There is a need in the art for a method of manufacturing kesterite photovoltaic devices which can produce cells with better structural properties and performance.

SUMMARY OF THE INVENTION

Embodiments of the present invention provide a thin film copper based chalcogenide photovoltaic device and a method for forming the same with an improved back contact region. The back contact region comprises a self-patterned ultrathin layer of aluminium oxide between the molybdenum back contact and the absorber.

In accordance with the first aspect, the present invention provides a method for forming a photovoltaic device comprising the steps of:

providing a first conductive material on a substrate;
depositing a continuous layer of a dielectric material on the first conductive material, the layer being thinner than 10 nm;
annealing the first conductive material and the layer of dielectric material;
forming a chalcogenide light-absorbing material on the layer of dielectric material; and
depositing a second material on the light-absorbing material such that the second material is electrically coupled to the light-absorbing material;
wherein the first conductive material and the dielectric material are selected such that, during the step of annealing, a portion of the first conductive material undergoes a chemical reaction to form a layer of a metal chalcogenide material at the interface between first conductive material and the dielectric material and openings form in the layer of dielectric material; the openings being such to allow electrical coupling between the light-absorbing material and the layer of a metal chalcogenide material.

The second material may be a conductive material or a semiconductive material.

The chalcogenide light-absorbing material may be formed by depositing a plurality of precursor materials on the layer of dielectric material and sulphurising the precursors.

In some embodiments, the step of annealing the first material and the layer of dielectric material is performed before the precursors are deposited. In alternative embodiments, the precursors are deposited before the annealing step and the first material, the layer of dielectric material and the precursors are annealed simultaneously.

In embodiments, the continuous layer of a dielectric material is deposited so that, before annealing, the plurality of precursor materials and the first material are electrically insulated.

The continuous layer of a dielectric material may have a thickness of a few nanometers, for example 1 nm or 2 nm.

The continuous layer of dielectric material may be deposited on the first material so that formation of voids in the region between the light-absorbing layer and the first material is reduced.

In some embodiments, during the step of annealing, the portion of the first material that undergoes a chemical reaction expands in volume and applies a tensile stress to the lattice structure of the layer of dielectric material so that the structure of dielectric material is altered and a self-organized nano-pattern of openings is formed in the layer of dielectric material.

The layer of metal chalcogenide material formed may be such to allow electrical conduction from the first material to the light-absorbing material during operation of the device. The layer may have a thickness comprised between 20 nm and 150 nm. The formed openings may have a diameter comprised between 50 nm and 250 nm. The surface density of the openings may be comprised between $6 \cdot 10^8$ openings/$cm^2$ and $10 \cdot 10^{10}$ openings/$cm^2$. Further, the dielectric material may be aluminium oxide, silicon oxide or $ZrO_2$.

The first material may be molybdenum and the metal chalcogenide material may be molybdenum sulphide or molybdenum selenide.

The light-absorbing material may be a CZTS or a CIGS layer. Further, the light-absorbing material may comprise selenium.

During annealing, sulphur or selenium may diffuse through the layer of a dielectric material to react with the molybdenum and form molybdenum sulphide or molybdenum selenide. Further, a portion of the diffused sulphur or selenium may originate from the CZTS or a CIGS layer.

In embodiments, the second material comprises one or a combination of CdS, $Zn_xCd_{(1-x)}S$, $Zn(O,S)$, $Zn_xSn_{(1-x)}O$, $SnO_2$, $Zn_xMg_{(1-x)}O$.

In accordance with the second aspect, the present invention provides a photovoltaic cell comprising:
- a substrate;
- a layer of a first conductive material;
- a layer of a metal chalcogenide material disposed on the first conductive material
- a layer of a dielectric material comprising a plurality of openings disposed on the layer of metal chalcogenide material, the layer of a dielectric material being thinner than 10 nm;
- a chalcogenide light-absorbing material disposed on the layer of dielectric material;
- a layer of a second material disposed on the light-absorbing material and arranged so as to be electrically coupled to the light-absorbing material;
- wherein the openings in the layer of a dielectric material are such that the light absorbing material is electrically coupled to the metal chalcogenide material.

Advantageous embodiments of the present invention allow reducing phase segregation and formation of voids at the back contact region of the photovoltaic device. Therefore, one of the advantages provided by the invention is the reduced carrier recombination at the back contact region.

A further advantage is provided by the ultrathin absorber layers that can be used in synergy with the self-patterned aluminium oxide. In addition, the aluminium oxide layer may provide a passivation effect to further reduce carrier recombination.

BRIEF DESCRIPTION OF THE DRAWINGS

Features and advantages of the present invention will become apparent from the following description of embodiments thereof, by way of example only, with reference to the accompanying drawings in which:

FIG. 6 shows transmission electron microscopy (TEM) images and electron diffraction scattering (EDS) data.

DETAILED DESCRIPTION OF EMBODIMENTS

Embodiments of the present invention relate to a thin film photovoltaic device comprising a copper based chalcogenide light-absorbing material and a method for forming the photovoltaic device.

The device comprises a self-patterned ultrathin layer of a dielectric material that allows reducing the carrier recombination at the rear region of the devices. For example, in embodiments, an aluminium oxide layer is positioned between the molybdenum back contact and the absorber layer of the photovoltaic device. During fabrication, the dielectric layer allows reducing phase segregation and formation of voids. During the manufacturing process, the dielectric layer self-organizes in a nano-pattern to allow carrier transport between the back contact of the device and the absorber layer.

The manufacturing of copper based chalcogenide photovoltaic devices, such as CZTS photovoltaic devices, generally involves the deposition of precursor materials which are thermally processed to form the final absorber of the device. In CZTS photovoltaic devices, for example, the device undergoes a sulphurisation step during which precursors containing copper, zinc and tin are annealed in a sulphur rich atmosphere to form the CZTS material.

In accordance with embodiments, a layer of dielectric material can be formed between the back contact of the device and the precursor materials. During processing, the dielectric layer allows to significantly reduce the formation of secondary phases at the back contact. At the same time, the dielectric layer allows for the formation of a metal chalcogenide region within the back contact material at the interface with the dielectric layer. For CZTS formed on molybdenum substrates, for example, a $MoS_2$ layer forms between the molybdenum and the dielectric layer during fabrication. The variation of morphology of the interface and expansion in volume facilitates the formation of a nano-pattern of openings in the dielectric layer to enable the conduction of current between the CZTS layer and the molybdenum.

Using this technique, the Applicants have been able to manufacture ultrathin kesterite CZTS thin film photovoltaic devices without phase segregation and voids and with reduced recombination at the back contact region. Improved performance have been achieved by controlling the interfacial reaction via an intermediate $Al_2O_3$ layer. This allowed to reach energy conversion efficiency of about 8.5%.

Figure 1:
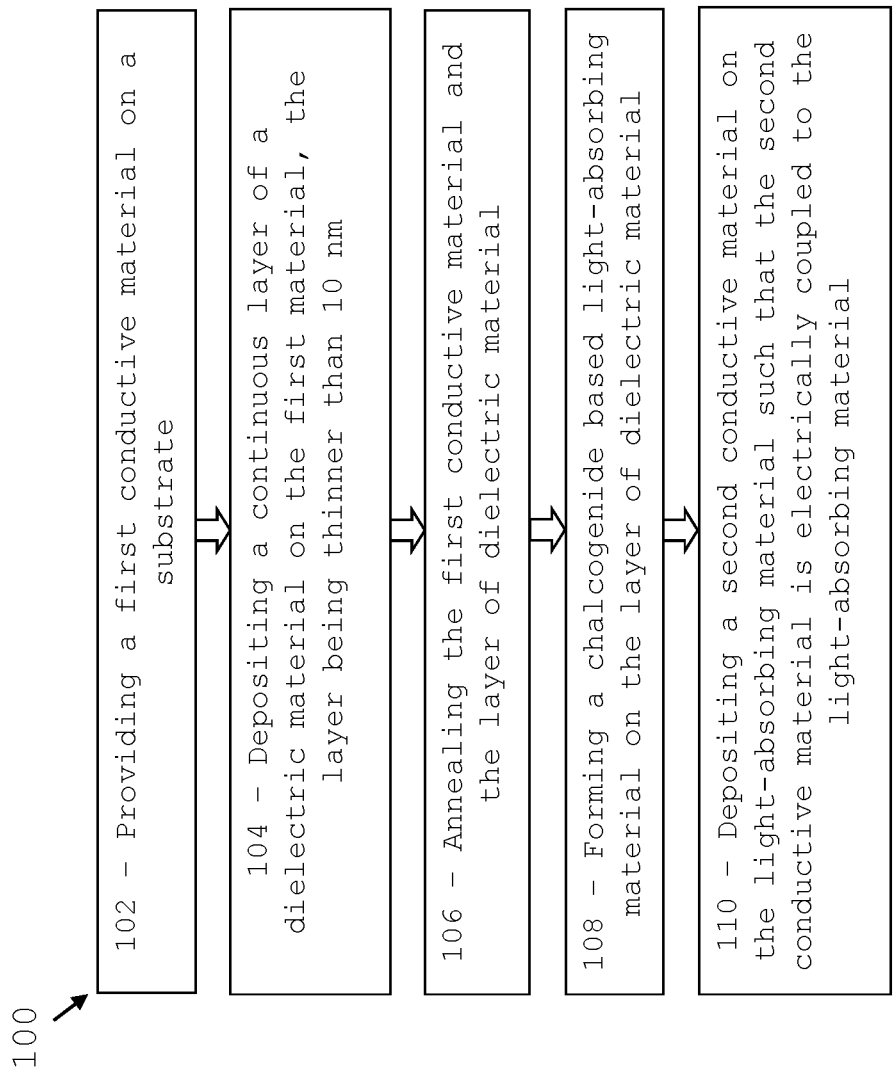
FIG. 1 shows a flow diagram outlining a method for forming a photovoltaic device.

Referring now to FIG. 1, there is shown a flow diagram 100 outlining a method for forming a CZTS photovoltaic device in accordance with the embodiments. Firstly, a substrate is provided upon which layers of different materials are deposited to form the photovoltaic device. The substrate is commonly made of soda lime glass material. The first step 102 involves depositing a layer of a first conductive material on the soda lime glass. In the embodiment described Molybdenum (Mo) is the conductive material and it is sputtered onto the soda lime glass substrate using a multi-target sputtering tool to form the back contact. The thickness of the Mo layer is around 1 μm. At step 104, a continuous layer of a dielectric material is deposited onto the conductive material. In the embodiments described, an $Al_2O_3$, layer with a thickness between 1 nm and 5 nm is deposited on the Mo layer. In alternative embodiments other stable dielectric materials such as $SiO_2$ or $ZrO_2$ may be used.

After this, precursor materials, comprising of copper, zinc and tin, are deposited onto the $Al_2O_3$ layer.

At steps 106 and 108, the Mo covered substrate, the layer of $Al_2O_3$ and the precursors are transferred into a furnace and annealed in a chalcogen atmosphere for a time period of 1 min to 120 mins. During this step, a CZTS layer is formed onto the $Al_2O_3$ layer and a $MoS_2$ layer with a thickness of about 100 nm is formed at the interface between the Mo and the $Al_2O_3$.

During the step of annealing, the intermediate $Al_2O_3$ layer prevents the direct contact of CZTS with Mo, thereby avoiding the chemical reaction leading to decomposition of CZTS into secondary phases and the formation of a thick Molybdenum Sulphate ($MoS_2$) interfacial layer. However, a thin $MoS_2$ layer forms at the interface of the Mo and the $Al_2O_3$ layer by Mo reacting with sulphur diffused from the chalcogen atmosphere or diffusion from the precursors through the $Al_2O_3$ layer. As a consequence of the formation of the thin $MoS_2$ layer, the $Al_2O_3$ layer undergoes microstructural changes and transforms into a nano-patterned layer. This self-organized nano-patterned $Al_2O_3$ layer has openings with a diameter comprised between 150 nm and 250 nm which facilitate the electrical contact between the CZTS light absorbing layer and the Mo.

In the embodiment described, the formation of the thin $MoS_2$ layer, the self-organized nano-patterned $Al_2O_3$ and the CZTS from the precursor materials, take place during the sulphurisation step.

In alternative embodiments, the structure comprising the substrate, the Mo layer and the $Al_2O_3$ may be annealed independently, as shown by step 106 of FIG. 1, before the sulphurisation step, or before the deposition of the precursor materials.

At 110, a second material is formed on the CZTS and a front contacting structure is formed at step 112 to facilitate carrier extraction from the device. In the embodiment described the second material is a semiconductive material, cadmium sulphide (CdS) in this instance, and the front contacting structure comprises a series of layers which are deposited in sequence on the CdS layer. The structure is placed in a multi-target sputtering deposition machine to deposit in sequence:

an IZO layer with a thickness of about 50 nm; and
an AZO layer with a thickness of about 300 nm at about 50° C.

Finally, Al contacts are thermally evaporated through a shadow mask to create an Al front electrode. Or alternatively a conductive Ag glue is applied as the top electrode.

Figure 2:
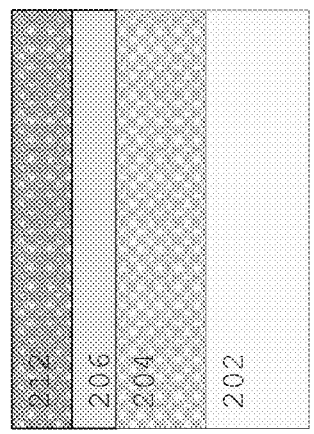
FIG. 2 shows schematic diagrams of a photovoltaic cell during different manufacturing steps.
Figure 2:
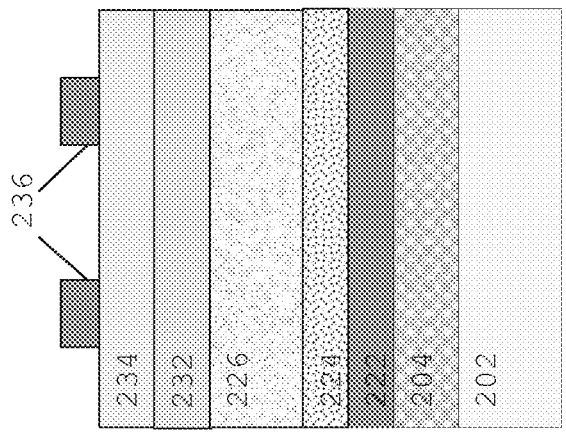
Figure 2:
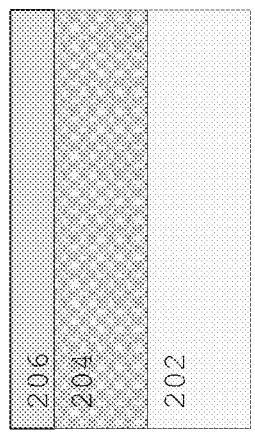
Figure 2:
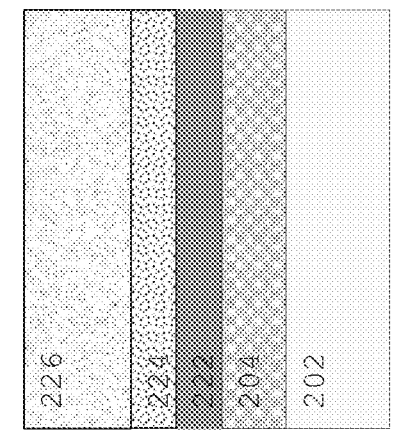
Figure 3B:
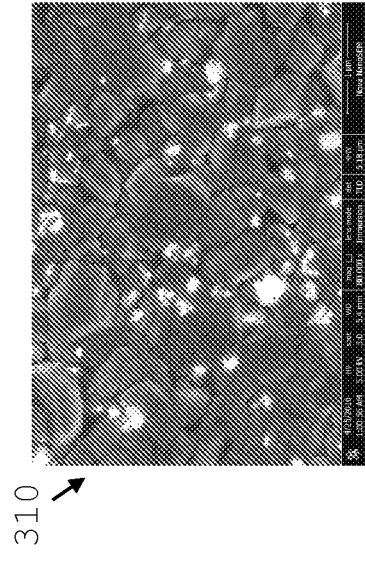
FIG. 3 shows SEM images of light-absorbing layers.
Figure 3A:
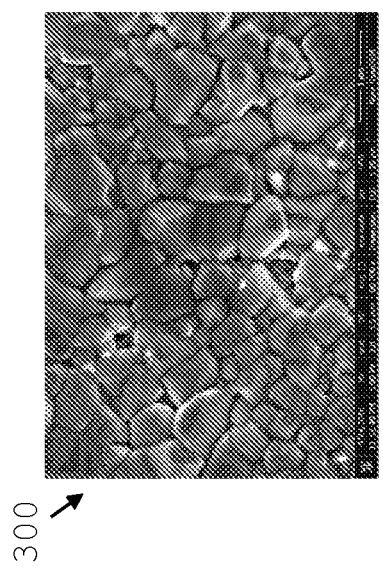
Figure 3D:
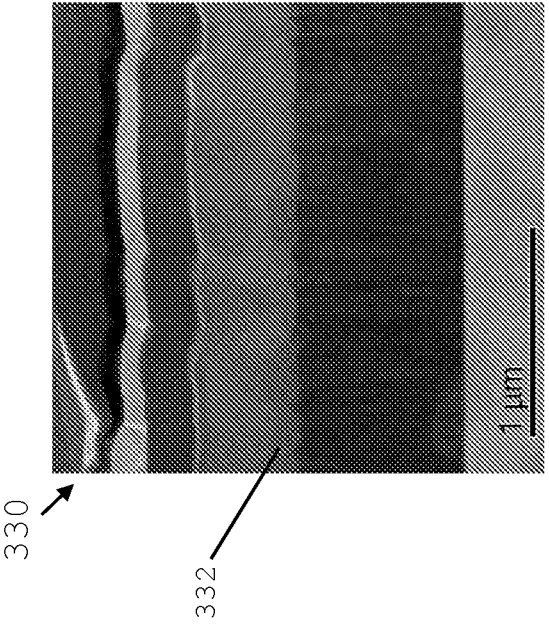
Figure 3C:
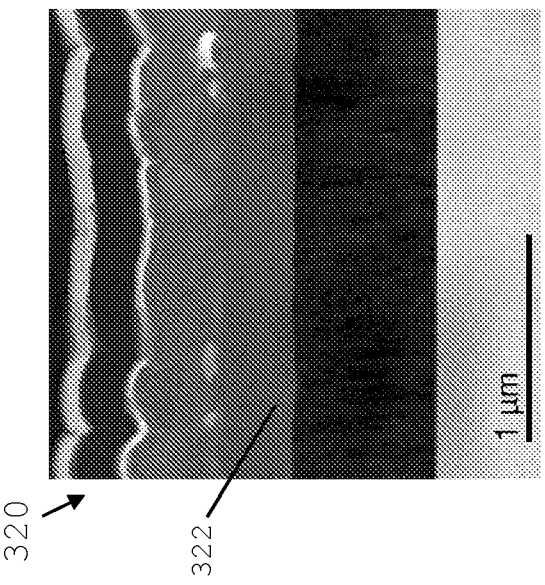

Referring now to FIG. 2, there is a shown a sequence of schematic illustrations of a device during different steps of the manufacturing process 100.

FIG. 2(*a*) shows the structure 200 comprising the soda-lime glass substrate 202, the molybdenum layer 204 and an $Al_2O_3$ layer 206 with a thickness of 2 nm.

In the structure 210 of FIG. 2(*b*), precursor materials 212 have been deposited onto the $Al_2O_3$ layer 205 using a multi-target co-sputtering tool. During the sulphurisation step, a thin region (about 100 nm) of $MoS_2$ 222 is formed in the Mo layer and the $Al_2O_3$ is rearranged in a self-organized nano-pattern 224. During the same sulphurisation step the precursor materials react to form CZTS absorber layer 226, as shown in structure 220 of FIG. 2(*c*).

Finally, FIG. 2(*d*) shows the structure 230 of the photovoltaic device including the CdS layer 232, the AZO/IZO stack 234 and metallic contacts 236.

Referring now to FIG. 3(*a*), there is shown an SEM surface morphology image 300 of the CZTS layer of a photovoltaic device comprising an intermediate $Al_2O_3$ layer in accordance with embodiments. FIG. 3(*b*) instead shows an SEM image 310 of the CZTS layer of a conventional chalcogenide based photovoltaic device.

By comparing image 300 to image 310 it is evident that the CZTS layer in image 300 has a more compact morphology.

The structure in 300 has less voids or pinholes than the structure in 310. In the photovoltaic device of image 300 the intermediate $Al_2O_3$ layer separates the CZTS and Mo layers, thereby avoiding the formation of a volatile material tin sulphate (SnS) at the bottom of CZTS layer. The compact morphology of the CZTS surface 300 is the result of the absence of the evaporation of volatile SnS formed due to the reaction of CZTS with Mo at their interface.

Both CZTS absorbers in 300 and 310 consist of well-crystallized grains and some of the grains show the size larger than 1 μm. However, the CZTS absorber in 300, which has an $Al_2O_3$ intermediate layer at back contact, shows more a more uniform grain size with less small grains. The Applicants demonstrated that the introduction of the $Al_2O_3$ thin layer can provide an amount of control of the back contact interface reaction and improves the homogeneity and compactness for CZTS absorber.

Referring now to FIG. 3(*c*), there is shown a TEM cross sectional image 320 of the photovoltaic device shown in FIG. 3(*a*). FIG. 3(*d*) instead shows a TEM cross sectional image 330 of the photovoltaic device shown of FIG. 3(*b*).

Image 320 shown a much thinner $MoS_2$ interface layer 322 in comparison to layer 332 of image 330. This means less consumption of Mo material and allows for a reduced series resistance of the device, which in turn improves the efficiency.

Figure 4A:
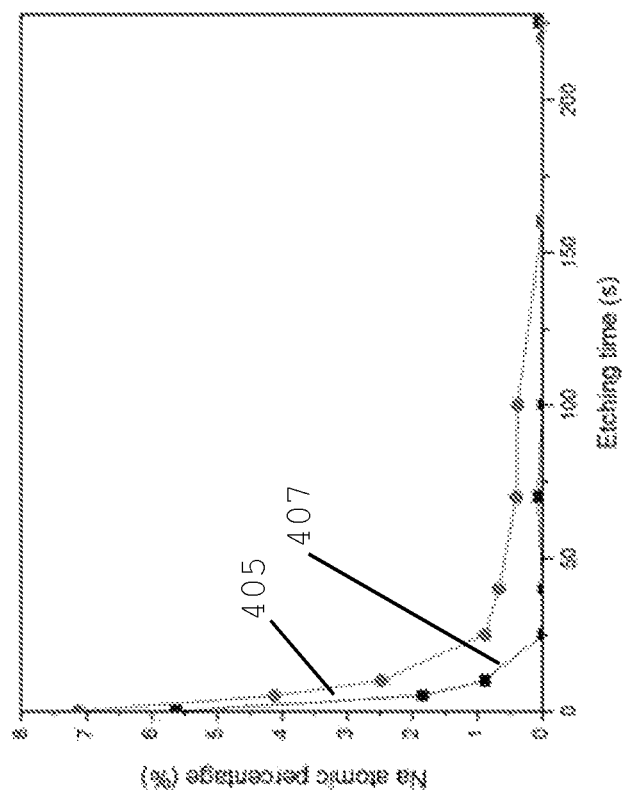
FIG. 4 shows comparisons plots for Raman spectra (a) and X-Ray photoelectron spectroscopy (XPS) of the sodium distributions.
Figure 4B:
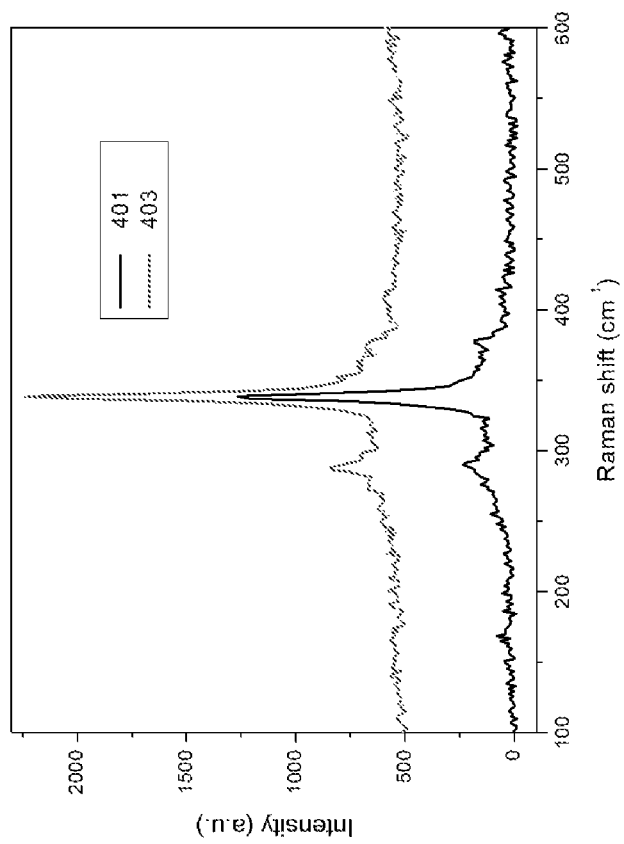

Referring now to FIG. 4(*a*), there is shown a comparison between the Raman spectra of CZTS of photovoltaic devices with (403) and without (401) the $Al_2O_3$ intermediate layer.

FIG. 4(*a*) shows that the absorption intensity at the main characteristic peak of CZTS (338 $cm^{-1}$) for spectrum 403 is much higher than the peak in 401. This is due to the lack of secondary phases in the device with the $Al_2O_3$ intermediate layer. The sharper peak suggests a relatively better crystalline quality of the CZTS.

The crystalline quality of the CZTS layer impacts the open circuit voltage ($V_{oc}$) of the photovoltaic device, which is a directly related to the efficiency of the device. The impact of the CZTS material crystallinity on the $V_{oc}$ is due to the inhibition of sodium (Na) diffusion by the intermediate layer.

FIG. 4(*b*) shows sodium distribution profiles for two different photovoltaic devices, one with an $Al_2O_3$ layer (profile 405) and second without an $Al_2O_3$ layer (profile 407). These profiles have been measured using an X-Ray Photoelectron Spectroscopy technique. The profiles show that the variation of sodium percentage against the etching time (or etching depth) of CZTS layer.

FIG. 4(*b*) demonstrates that sodium is mainly distributed within the upper portion of the CZTS layer for both devices. In the device with the $Al_2O_3$ layer a relatively higher Na content has been observed in comparison to the device without the $Al_2O_3$ layer. This can be attributed to the voids-free microstructure of the interface at the back contact. In fact, voids can block Na diffusion from the soda-lime glass into the CZTS absorber. In addition, these voids may lead to ununiformed Na diffusion and distribution in the absorber.

Referring now to FIG. 5 there are shown three plots that allow comparing optical and electrical performance of devices.

FIG. 5(*a*) shows the current density-voltage (J-V) curves of the CZTS devices with (502) and without (504) an $Al_2O_3$ intermediate layer. The electrical parameters measured from the device are summarized in Table 1. The devices with the $Al_2O_3$ intermediate layer show a substantial enhancement in $V_{OC}$ and FF, and a slightly increased $J_{SC}$.

The conversion efficiency is significantly increased from 7.45% to 8.60%. The enhancement in $V_{OC}$ and FF, accompanied by a reduction in A and $J_0$, is related to the reduced recombination at back contact region from the eliminated phase segregation and voids, and improved the crystalline quality.

FIG. 5(*b*) shows the room temperature photoluminescence (PL) spectra of the finished ultrathin CZTS devices (0.45 $cm^2$) with (506) and without (508) an $Al_2O_3$ intermediate layer. Furthermore, FIG. 5(*c*) shows time-resolved photoluminescence (TRPL) measurements of CZTS devices with (505) and without (503) an $Al_2O_3$ intermediate layer.

The PL measurements show a weaker PL intensity in 508 for device without $Al_2O_3$ intermediate layer at back contact. The minority carriers lifetime, estimated from the TRPL measurements, is 7.6 ns for the devices without the $Al_2O_3$ intermediate layer and 10.1 ns for the devices with the $Al_2O_3$ intermediate layer. This is an indication of the passivation capabilities of the $Al_2O_3$ intermediate layer.

The increase in $J_{SC}$ can be linked to the reduced thickness of the $MoS_2$ and therefore reduced $R_S$ (which also contributes to FF improvement).

Figure 5A:
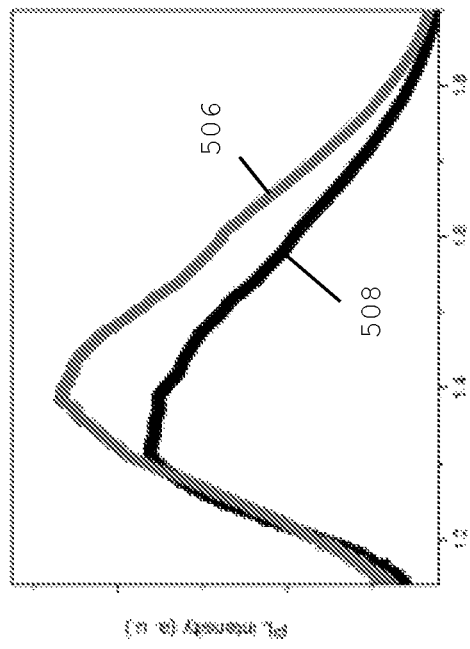
FIG. 5 shows comparative plots for optical and electrical performance of photovoltaic devices.
Figure 5B:
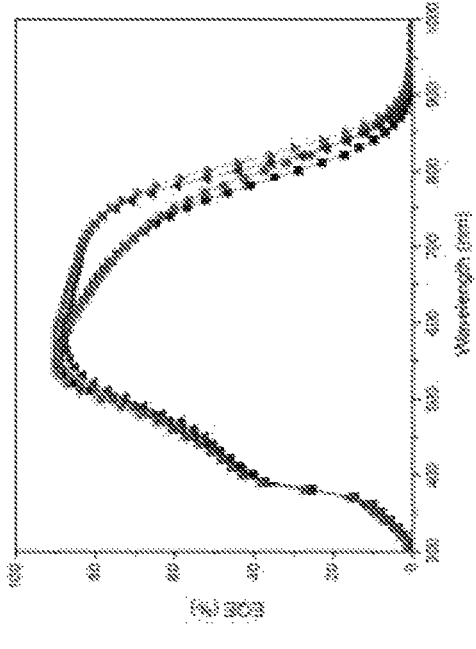
Figure 5C:
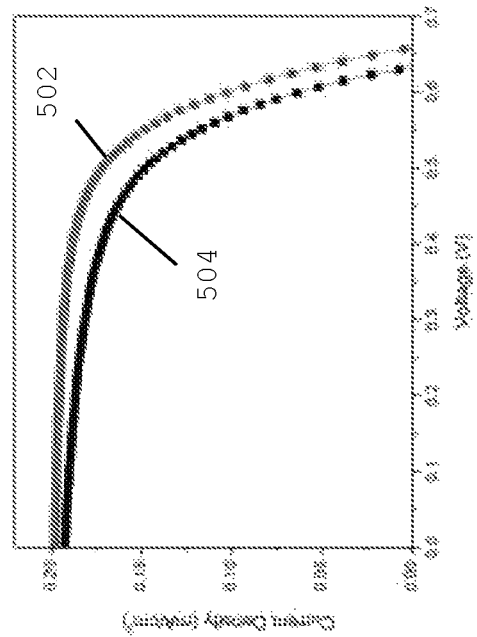
Figure 5D:
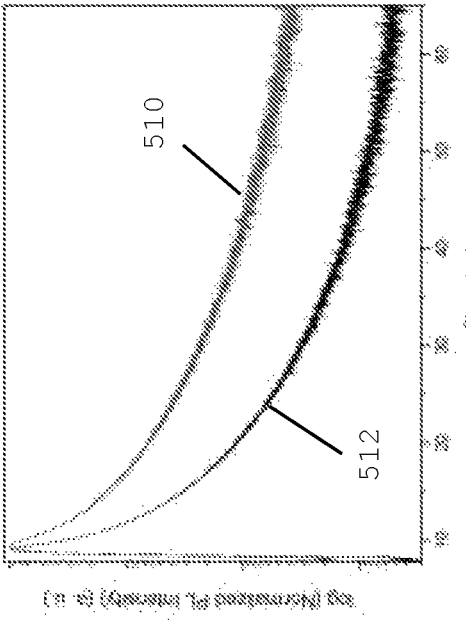

Finally, FIG. 5(d) shows an external quantum efficiency (EQE) comparison. The EQE results are indicative that the main losses for ultra-thin CZTS devices are in the long wavelength range, suggesting insufficient absorption of incident long wavelength photons. The Applicants have shown that in some instances the $Al_2O_3$ can be arranged to improve the optical properties of the device, for example light trapping. In FIG. 5(c) the 'square' trace is the EQE for a device with a 400 nm thick absorber and no $Al_2O_3$ layer; the 'circle' trace is the EQE for a device with a 400 nm thick absorber with an $Al_2O_3$ layer; the 'up-triangle' trace is the EQE for a device with a 800 nm thick absorber and no $Al_2O_3$ layer; and the 'down-triangle' trace is the EQE for a device with a 800 nm thick absorber with an $Al_2O_3$ layer.

TABLE 1 performance parameters of a photovoltaic device with $Al_2O_3$ layer realised in accordance with embodiments.

| Absorber thickness (nm) | $Al_2O_3$ (nm) | Voc (mV) | Jsc (mA/cm$^2$) | FF (%) | Efficiency (%) |
|---|---|---|---|---|---|
| 400 | 0 | 632.0 | 19.00 | 61.12 | 7.34 |
|  | 3 nm | 657.8 | 19.76 | 65.91 | 8.57 |
| 800 | 0 | 618.4 | 20.6 | 58.9 | 7.50 |
|  | 3 | 634.5 | 21.5 | 60.62 | 8.24 |

FIG. 6 shows transmission electron microscopy (TEM) images and electron diffraction scattering (EDS) data for photovoltaic devices manufactured in accordance with embodiments.

In particular, FIG. 6(a) shows the typical TEM cross-sectional image (high angle annular dark-field, HAADF) and FIG. 6(b) shows the EDS elemental mapping taken from the interfacial region at the back contact of a typical ultra-thin CZTS solar cell without any intermediate layer.

From the TEM cross-sectional image, the Mo layer 602 and the $MoS_2$ 622 can be observed. The absorber 626 can also be observed at the top part of the TEM images. FIG. 6(a) clearly shows voids 628 at the back contact and the thickness of the $MoS_2$ interfacial layer is as high as 300 nm. From the EDS elemental composition maps, bright domains in the composition map of Zn are detected at the bottom of the CZTS, indicating lumps of ZnS. The slight difference in the brightness of Cu and Sn at the corresponding location suggests the existence of Zn-based secondary phase only, such as ZnS segregation at the back contact region.

FIG. 6(c) shows the typical TEM cross-sectional image (high angle annular dark-field, HAADF) and FIG. 6(d) shows the EDS elemental mapping taken from the interfacial region at the back contact of an ultra-thin CZTS solar cell with a thin $Al_2O_3$ intermediate layer (about 3 nm) at the CZTS/Mo interface.

FIG. 6(c) shows that the voids and ZnS segregation are absent in the device with the $Al_2O_3$ intermediate layer and the $MoS_2$ interfacial layer shows has a thickness of only ~100 nm. By comparing FIGS. 6(a) and 6(c) carefully, black contrasts that are not continuous can be observed between the CZTS and $MoS_2$. These result from element(s) with lower atomic number. Combining the composition map of Al, these black contrasts correspond to the dispersed $Al_2O_3$ aggregates. This indicates that the introduced $Al_2O_3$ intermediate layer sputtered on the Mo back contact turns into discontinuous aggregates after sulfurization, which could form nano-patterned $Al_2O_3$ arrays between CZTS and $MoS_2$ with openings for their connection.

The term "comprising" (and its grammatical variations) as used herein are used in the inclusive sense of "having" or "including" and not in the sense of "consisting only of".

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The invention claimed is:

1. A method for forming a photovoltaic device comprising the steps of:
   providing a first conductive material on a substrate;
   depositing a layer of a dielectric material on the first conductive material, the layer of the dielectric material being continuous and being thinner than 10 nm;
   depositing a plurality of precursor materials on the layer of the dielectric material;
   annealing the first conductive material, the layer of the dielectric material and the plurality of precursor materials in a chalcogen atmosphere to form a chalcogenide light-absorbing material on the layer of the dielectric material; and
   depositing a second material on the light-absorbing material such that the second material is electrically coupled to the light-absorbing material;
   wherein during the step of annealing:
   the plurality of precursors react to form the chalcogenide light-absorbing material; and
   wherein the first conductive material and the dielectric material are selected such that, during the step of annealing, a portion of the first conductive material undergoes a chemical reaction to form:
      a layer of a metal chalcogenide material at the interface between first conductive material and the dielectric material; and
      a plurality of openings in the layer of the dielectric material; the openings being such to allow electrical coupling between the light-absorbing material and the layer of the metal chalcogenide material; and
   wherein the portion of the first conductive material that undergoes the chemical reaction during the annealing expands in volume and applies a tensile stress to a lattice structure of the layer of the dielectric material so that the lattice structure is altered to form a self-organized nano-pattern of openings in the layer of the dielectric material.

2. The method of claim 1 wherein the step of depositing the layer of the dielectric material on the first conductive material is performed in a manner such that, before the annealing step is performed, the plurality of precursor materials and the first conductive material are electrically insulated.

3. The method of claim 1 wherein the step of depositing the layer of the dielectric material on the first conductive material is performed in a manner such that formation of voids in the region between the light-absorbing layer and the first conductive material is reduced.

4. The method of claim 1 wherein the layer of the metal chalcogenide material is such to allow electrical conduction from the first conductive material to the light-absorbing material during operation of the photovoltaic device.

5. The method of claim 1, wherein during the step of annealing, sulphur or selenium diffuses through the layer of the dielectric material to react with molybdenum of the first conductive material to form molybdenum sulphide or molybdenum selenide.

6. The method of claim 5 wherein a portion of the sulphur or selenium diffusing through the layer of the dielectric material originates from the chalcogenide light-absorbing material.

7. The method of claim 1, wherein the layer of the metal chalcogenide material has a thickness comprised between 20 nm and 150 nm.

8. The method of claim 1, wherein the openings in the layer of the dielectric material have a diameter comprised between 50 nm and 250 nm.

9. The method of claim 1, wherein a surface density of the openings in the layer of the dielectric material is comprised between $6 \times 10^8$ openings/cm$^2$ and $10 \times 10^{10}$ openings/cm$^2$.

10. A method for forming a photovoltaic device comprising the steps of:
    providing a first conductive material on a substrate;
    depositing a layer of a dielectric material on the first conductive material, the layer of the dielectric material being continuous and being thinner than 10 nm;
    annealing the first conductive material and the layer of the dielectric material;
    depositing a plurality of precursor materials on the layer of the dielectric material;
    annealing the first conductive material, the layer of the dielectric material and the plurality of precursor materials in a chalcogen atmosphere to form a chalcogenide light-absorbing material on the layer of the dielectric material; and
    depositing a second material on the light-absorbing material such that the second material is electrically coupled to the light-absorbing material;
    wherein the first conductive material and the dielectric material are selected such that, during the step of annealing the first conductive material and the layer of the dielectric material, a portion of the first conductive material undergoes a chemical reaction to form:
        a layer of a metal chalcogenide material at the interface between first conductive material and the dielectric material; and
        a plurality of openings in the layer of the dielectric material; the openings being such to allow electrical coupling between the light-absorbing material and the layer of the metal chalcogenide material.

11. The method of claim 10, wherein the step of depositing the layer of the dielectric material on the first conductive material is performed in a manner such that formation of voids in the region between the light-absorbing layer and the first conductive material is reduced.

12. The method of claim 10, wherein, during the step of annealing the first conductive material and the layer of the dielectric material, the portion of the first conductive material that undergoes a chemical reaction expands in volume and applies a tensile stress to the lattice structure of the layer of the dielectric material so that the structure is altered and a self-organised nano-pattern of openings is formed in the layer of the dielectric material.

13. The method of claim 10, wherein the layer of the metal chalcogenide material is such to allow electrical conduction from the first conductive material to the light-absorbing material during operation of the photovoltaic device.

14. The method of claim 10, wherein during the step of annealing the first conductive material and the layer of the dielectric material, sulphur or selenium diffuses through the layer of the dielectric material to react with molybdenum of the first conductive material to form molybdenum sulphide or molybdenum selenide.

* * * * *